United States Patent [19]
Kutzer

[11] Patent Number: 5,614,817
[45] Date of Patent: Mar. 25, 1997

[54] METHOD AND DEVICE FOR DETERMINING THE REAL POWER OF A DC ELECTRICAL DRIVE

[75] Inventor: Heinz Kutzer, Maintal, Germany

[73] Assignee: Siemens Aktiengesellschaft, Munich, Germany

[21] Appl. No.: 494,052

[22] Filed: Jun. 23, 1995

Related U.S. Application Data

[63] Continuation of PCT/DE93/01183, Dec. 10, 1993.

[30] Foreign Application Priority Data

Dec. 23, 1992 [DE] Germany ............................. 42 43 914.0

[51] Int. Cl.⁶ ............................. H02P 7/42; G01R 19/00
[52] U.S. Cl. ........................... 324/142; 318/798; 318/729; 318/812; 318/799; 324/772
[58] Field of Search ............................. 324/142, 772; 318/798, 729, 812

[56] References Cited

U.S. PATENT DOCUMENTS

| | | | |
|---|---|---|---|
| 4,355,274 | 10/1982 | Borbeau | 318/812 |
| 4,602,200 | 7/1986 | Walker | 318/798 |
| 4,823,067 | 4/1989 | Weber | 318/799 |
| 5,428,283 | 1/1995 | Kalman et al. | 318/729 |
| 5,471,134 | 11/1995 | Oudillet et al. | 324/103 P |
| 5,483,111 | 1/1996 | Kuznetsov | 310/12 |

FOREIGN PATENT DOCUMENTS 272710 10/1989 Germany.

*Primary Examiner*—Kenneth A. Wieder
*Assistant Examiner*—Barry C. Bowser
*Attorney, Agent, or Firm*—Herbert L. Lerner; Laurence A. Greenberg

[57] ABSTRACT

A method for determining the real power of an electrical drive, preferably an electrical fitting drive, includes subtracting an ohmic or resistive power loss in a stator of the drive from a measured real power. It is intended that an ohmic or resistive power loss in a connecting line of the drive also be subtracted. A device for determining the real power of an electrical drive includes line pairs each connecting two connecting lines remotely from the drive, to a DC voltage source. A known ohmic or non-reactive resistor is inserted into one of the lines in each case. Each of the lines is connected on the side of the ohmic or non-reactive resistor facing toward the drive, through a voltmeter, to the other line. The voltmeters are connected to an evaluation unit.

8 Claims, 1 Drawing Sheet

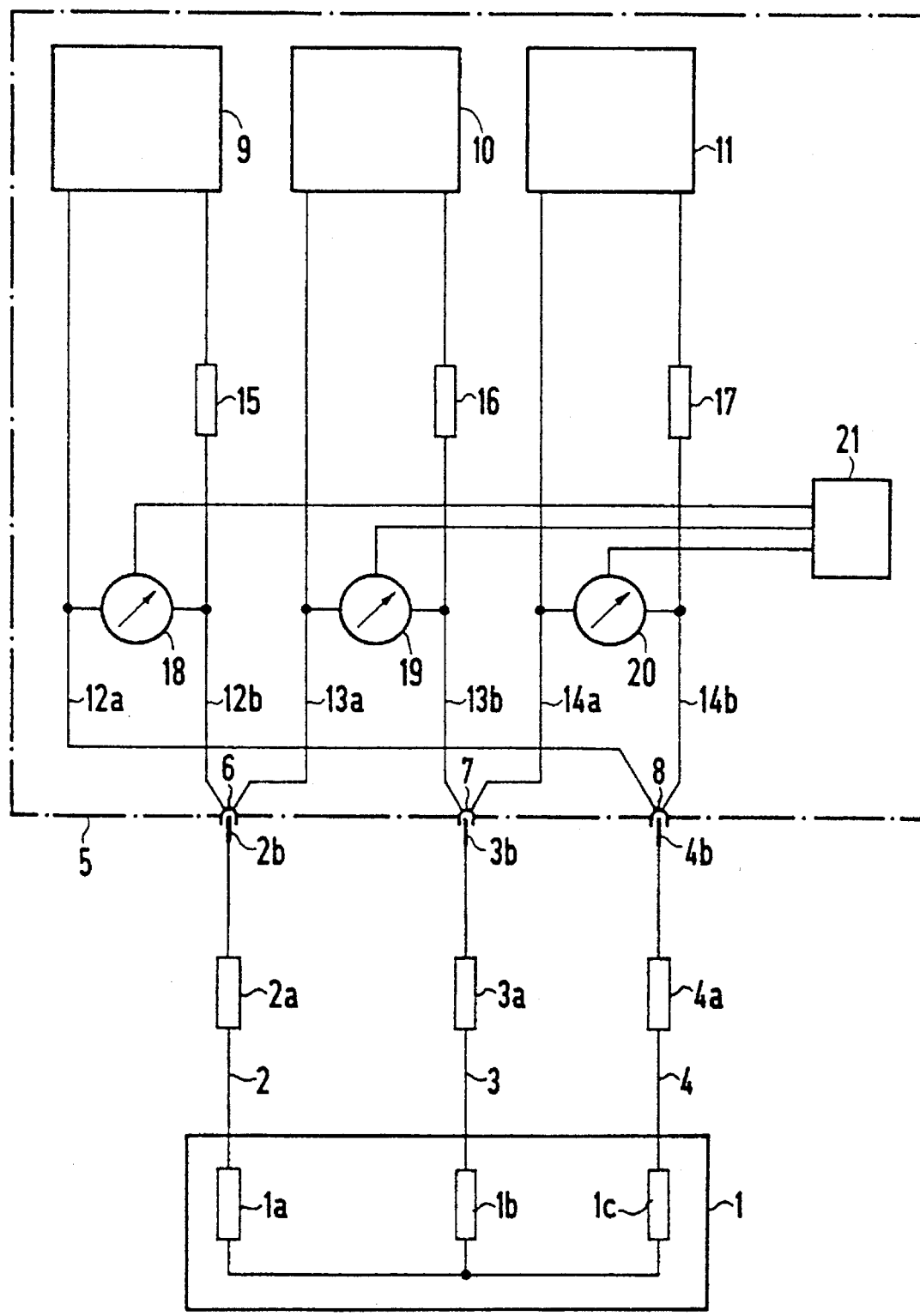

METHOD AND DEVICE FOR DETERMINING THE REAL POWER OF A DC ELECTRICAL DRIVE

CROSS-REFERENCE TO RELATED APPLICATION

This application is a Continuation of International Application Serial No. PCT/DE93/01183, filed Dec. 10, 1993.

BACKGROUND OF THE INVENTION

1. Field of the Invention

The invention relates to a method for determining the real power of an electrical drive, preferably an electrical fitting drive, which includes subtracting an ohmic or resistive power loss produced in a stator of the drive from a measured real power. The invention also relates to a device for determining the real power of an electrical drive, preferably an electrical fitting drive, which includes connecting lines for stator windings of the drive.

A fitting diagnosis is a measurement and evaluation method which can be carried out on a fitting. The use of that method permits early identification of whether or not the condition of the fitting has changed in such a way that there is a risk of failure or at least restricted operation of the fitting. Fitting diagnosis includes measurement of the real power of an electrical drive of the fitting. Any change in the real power, particularly in conjunction with a change in other variables, indicates a defect in the fitting.

It is already known for the measured real power to have to be corrected before it can provide information on the condition of the fitting.

It has already been proposed for the ohmic or resistive loss in the stator of the fitting drive as well as the inductive loss in the stator and the ohmic or resistive and inductive losses in the rotor of the drive to be subtracted from the measured real power in order to correct the real power.

The corrected real power values which are obtained in that way are subject to fluctuations which cannot be traced back to defects in the fitting. Reliable fitting diagnosis is thus impossible by using those corrected values of the real power of an electrical drive.

SUMMARY OF THE INVENTION

It is accordingly an object of the invention to provide a method and a device for determining the real power of an electrical drive, which overcome the hereinafore-mentioned disadvantages of the heretofore-known methods and devices of this general type and which make it possible to determine a real power value that unambiguously indicates a defect in the drive or in a fitting to which the drive belongs.

With the foregoing and other objects in view there is provided, in accordance with the invention, a method for determining the real power of an electrical drive, preferably of an electrical fitting drive, having a stator and a connecting line producing ohmic power losses, which comprises subtracting the ohmic power loss produced in the stator of the drive from a measured real power, and additionally subtracting the ohmic power loss produced in the connecting line of the drive.

Specifically, the invention is based on the knowledge that the change in the power loss in the connecting line of the drive is relatively large, while the changes in the inductive losses in the stator and the changes in the losses in the rotor are negligibly small. Those losses have so far been taken into account. A largely constant loss has no disturbing effect since, for example, it does not adversely affect the identification of a defect.

An advantage which results from the method according to the invention is that a corrected real power can be determined which very closely approximates the mechanical power emitted by the drive. The corrected real power is not largely identical to the emitted mechanical power unless the ohmic or resistive loss in the connecting line, which loss was not taken into account in the past, is taken into account. Since the emitted mechanical power provides information on the reliability of the drive and of the driven fitting, a good, reliable diagnosis, for example a fitting diagnosis, can be carried out by using the method according to the invention.

In accordance with another mode of the invention, power losses in the rotor of the drive are, for example, not taken into account. It has been found that those losses are very small in comparison to the power loss in the connecting line. It is thus possible to obtain a reliable statement on the corrected real power, and thus on the condition of the drive and of the fitting, even without determining the losses in the rotor.

In accordance with a further mode of the invention, no inductive power losses are taken into account when determining the real power. Specifically, it has also been found that the inductive losses are negligibly small in comparison to the power loss in the connecting line. The advantage which this achieves is that a reliable statement is obtained on the condition of the drive and of the fitting even without a complex determination of the inductive power losses.

Through the use of the method according to the invention, the mechanical power emitted by the drive is determined so reliably through the corrected real power, that in the case of a diagnosis, the condition of the drive and of the fitting can be determined well by using the corrected real power, possibly together with other electrical measurement variables. No mechanical variables need additionally be measured for a fitting diagnosis, which would introduce error sources as a result of complex measurement methods. The corrected value for the real power, which is determined by using the method according to the invention, corresponds to the mechanical power which is emitted by the drive, to the extent that a reliable fitting diagnosis can be carried out even without measuring mechanical variables.

With the objects of the invention in view, there is also provided a device for determining the real power of an electrical drive, preferably of an electrical fitting drive, comprising connecting lines for stator windings of a drive, the connecting lines having connecting points remote from the drive; a DC voltage source; line pairs each having one line and another line, each of the line pairs connecting the connecting points of two of the connecting lines to the DC voltage source; known ohmic resistors each being connected into the one line of a respective one of the line pairs; voltmeters each being connected to the one line at a location between the ohmic resistor and the connecting point and each being connected to the other line of a respective line pair; and an evaluation unit connected to the voltmeters.

The ohmic or resistive power losses in the connecting line and in the stator are calculated there and are subtracted from a measured real power.

In accordance with a concomitant feature of the invention, the voltmeters are a component of the evaluation unit which is then connected to voltage taps of the line pairs, for voltage measurement.

The DC voltage sources are required only during measurement of the power losses. When the drive is in the operating mode, an AC voltage is applied to its connecting lines. In order to determine the power losses, a correction device is connected to the connecting lines, at connecting points. Direct current is then fed by the DC voltage sources, which are located in the correction device, to the drive, with the AC voltage switched off. The connecting points are not located directly on the drive but in the region of those ends of the connecting lines which are remote from the drive. This ensures that the ohmic or resistive power loss throughout the connecting lines can also be measured, in addition to the ohmic or resistive power loss in the stator of the drive, which is connected to the connecting lines.

In the case of the device according to the invention, line pairs each connect two of the connecting lines to a DC voltage source, through the connecting points. In each case a known ohmic or non-reactive resistor is inserted into one of the two lines of a line pair. On the drive side of the ohmic or non-reactive resistor, this line is connected, from a location between the ohmic or non-reactive resistor and the connecting point, through a voltmeter, to the other line of the line pair. The voltmeters are connected to an evaluation unit. They can also be a component of this evaluation unit. The ohmic or non-reactive losses in the connecting line and in the stator are calculated there. It is only the value of the current intensity in the connecting line that is additionally required for this purpose. In order to correct a previously measured total real power, the calculated ohmic or resistive power loss is subtracted from the total real power. The remaining corrected value largely corresponds to the mechanical power emitted by the drive. In the case of a diagnosis of a fitting which is connected to the drive, it can thus indicate the reliability of the fitting even without any additional mechanical variables.

The use of the method and the device according to the invention ensures reliable fitting diagnosis, preferably just by using electrical measurement variables.

Other features which are considered as characteristic for the invention are set forth in the appended claims. Although the invention is illustrated and described herein as embodied in a method and a device for determining the real power of an electrical drive, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The FIGURE of the drawing is a schematic and block circuit diagram of a device according to the invention which will be used below to explain the method in more detail.

DESCRIPTION OF THE PREFERRED EMBODIMENTS

Referring now to the single FIGURE of the drawing in detail, there is seen an equivalent circuit for a drive having a connecting line connected to a device for determining the real power of the drive.

An electrical drive 1 which is, for example, a fitting drive, has a stator and a rotor. Connecting lines 2, 3, 4 are connected to the stator of the drive 1, in order to supply power. A product of an applied voltage and a current intensity of the current which is flowing is determined in order to determine the real power of the electrical drive 1. The real power is intended to provide information on the mechanical condition of the drive 1, and preferably of the fitting which is connected to the drive 1. To this end, it is necessary that power losses be determined and the measured real power be corrected. On one hand, a confirmation that the power losses in the rotor and the inductive losses in the stator are so small that they do not need to be taken into account is essential for the method and the device according to the invention. On the other hand, the resistive or ohmic power losses in the connecting lines of the drive must not be left unconsidered.

The drawing shows the drive 1 to which three connecting lines 2, 3, 4 are assigned. An ohmic or non-reactive resistance of the stator winding of the drive 1 is represented by resistors 1a, 1b, 1c as the equivalent circuit. Non-reactive resistances of the long connecting lines 2, 3, 4, which may extend over a distance of more than 100 m from a power station control panel to a fitting in the power station, are represented by ohmic or non-reactive resistors 2a, 3a, 4a in the drawing, as an equivalent circuit. A correction device 5 is provided in order to determine resistive or ohmic power losses in the stator of the drive 1 and in the connecting lines 2, 3, 4. The correction device 5 can be connected to connecting points 2b, 3b, 4b of the connecting lines 2, 3, 4 after switching off the voltage supply. The connecting points 2b, 3b, 4b, which can be connecting sockets, are located in the vicinity of an end of the connecting lines 2, 3, 4 which is remote from the drive.

The correction device 5 has plugs 6, 7, 8 which can be connected to the connecting sockets of the connecting points 2b, 3b, 4b. Other connecting elements can also be provided instead of the plugs 6, 7, 8. Three DC voltage sources 9, 10, 11 are each connected to a respective two of the plugs 6, 7, 8. In order to ensure that the power loss can be determined quickly and reliably, the three DC voltage sources 9, 10, 11 are provided for the three connecting lines 2, 3, 4. It would also be possible to manage with only one DC voltage source 9, provided that those lines which originate from the DC voltage sources 10 and 11 in the drawing are also connected to the DC voltage source 9. Each DC voltage source 9, 10, 11 in the correction device 5 is connected through a respective line pair 12a, 12b; 13a, 13b; 14a, 14b to two of the plugs 6, 7, 8. In the present example, the line pair 12a, 12b connects the plugs 8 and 6 to the DC voltage source 9. The line pair 13a, 13b connects the plugs 6 and 7 to the DC voltage source 10. The line pair 14a, 14b connects the plugs 7 and 8 to the DC voltage source 11. In each case a known ohmic or non-reactive resistor 15, 16, 17 is inserted into a respective one of the lines 12b, 13b, 14b of a line pair. Voltmeters 18, 19, 20 are disposed between the lines of each line pair 12a, 12b; 13a, 13b; 14a, 14b and originate from the line 12b, 13b, 14b between this ohmic or non-reactive resistor 15, 16, 17 and the plug 6, 7, 8 or the connecting point 2b, 3b, 4b. Therefore, the voltmeters are connected between the one lines 12b, 13b, 14b and the other lines 12a, 13a, 14a of the line pairs. If the DC voltage which is applied by the DC voltage source 9, 10, 11 is known and if the ohmic or non-reactive resistance of the resistors 15, 16, 17 is known, each voltmeter 18, 19, 20 shows the voltage drop across the ohmic or non-reactive resistors 2a, 3a, 4a of two of the connecting lines 2, 3, 4 and across the ohmic or non-reactive resistors 1a, 1b, 1c of the stator windings which are connected to these connecting lines 2, 3, 4.

The voltmeters 18, 19, 20 are connected to an evaluation unit 21. They can also be integrated in the evaluation unit 21, so that the evaluation unit 21 can be connected directly to taps or pick-offs on the line pairs 12a, 12b; 13a, 13b; 14a, 14b. The power losses which have to be taken into account in order to correct the measured real power are determined there. Since only ohmic or resistive power losses are taken into account using the method according to the invention, the measurements can all be carried out with DC voltage applied.

High accuracy is achieved as a result of the fact that the power losses for the connecting lines 2, 3, 4 and the associated stator windings of the drive 1 are determined in pairs. The voltage drops across the resistor pairs 1a, 2a; 1b, 3a; 1c, 4a are determined in the evaluation unit 21 from the measured values of the voltmeters 18, 19, 20, by comparison of these measured values, in order to determine the power losses. The power losses are obtained by multiplication by the current intensity which is to be determined. These power losses must be subtracted from the real power which is determined while the drive 1 is in operation. The corrected real power of the drive 1 which is determined in this way, largely corresponds to the actual power of the drive 1 and, with a small error, can be equated with the mechanical power of the drive 1 and thus with the mechanical power of the fitting which is connected to the drive 1. The corrected real power is a reliable measure of the condition of the drive 1 and of the fitting. There is no need to use mechanical measured variables which are costly to determine, in order to be able to identify the condition and the reliability of the fitting during a fitting diagnosis.

By taking the power losses in the connecting lines 2, 3, 4 into account, reliable statements on the condition of the drive 1 and of the fitting are obtained even when the connecting lines 2, 3, 4 are very long. Instruments for fitting diagnosis, for example the correction device 5, can thus be accommodated in a power station control panel which may be at a distance of 100 m or more from the drive 1 that is to be tested, without measurement errors occurring. The fitting diagnosis is thus simplified, because measurements in the vicinity of the drive 1 and of the fitting are costly. Particularly in the case of nuclear power stations, measurement in the vicinity of the fitting is costly, because of the radioactive radiation.

I claim:

1. A method for determining the real power of an electrical drive having a stator and a DC voltage connecting line producing ohmic power losses, which comprises:

subtracting the ohmic power loss produced in the stator of the drive from a measured real power; and additionally subtracting the ohmic power loss produced in the DC voltage connecting line of the drive from the measured real power.

2. The method according to claim 1, which comprises not taking power losses produced in a rotor of the drive into account.

3. The method according to claim 1, which comprises not taking inductive power losses into account.

4. A method for determining the real power of an electrical fitting drive having a stator and a DC voltage connecting line producing ohmic power losses, which comprises:

subtracting the ohmic power loss produced in the stator of the drive from a measured real power; and additionally subtracting the ohmic power loss produced in the DC voltage connecting line of the drive from the measured real power.

5. A device for determining the real power of an electrical drive, comprising:

connecting lines for stator windings of a drive, said connecting lines having connecting points remote from the drive;

a DC voltage source;

line pairs each having one line and another line, each of said line pairs connecting said connecting points of two of said connecting lines to said DC voltage source;

known ohmic resistors each being connected into said one line of a respective one of said line pairs;

voltmeters each being connected to said one line at a location between said ohmic resistor and said connecting point and each being connected to said other line of a respective line pair; and an evaluation unit connected to said voltmeters.

6. The device according to claim 5, wherein said lines have taps, said voltmeters are a component of said evaluation unit, and said evaluation unit is connected to said taps for voltage measurement.

7. A device for determining the real power of an electrical fitting drive, comprising:

connecting lines for stator windings of a drive, said connecting lines having connecting points remote from the drive;

a DC voltage source;

line pairs each having one line and another line, each of said line pairs connecting said connecting points of two of said connecting lines to said DC voltage source;

known ohmic resistors each being connected into said one line of a respective one of said line pairs;

voltmeters each being connected to said one line at a location between said ohmic resistor and said connecting point and each being connected to said other line of a respective line pair; and an evaluation unit connected to said voltmeters.

8. The device according to claim 7, wherein said lines have taps, said voltmeters are a component of said evaluation unit, and said evaluation unit is connected to said taps for voltage measurement.

* * * * *